(12) United States Patent
Maheshwari

(10) Patent No.: US 9,015,406 B2
(45) Date of Patent: Apr. 21, 2015

(54) FLASH MEMORY CACHE FOR DATA STORAGE DEVICE

(71) Applicant: Nimble Storage, Inc., San Jose, CA (US)

(72) Inventor: Umesh Maheshwari, San Jose, CA (US)

(73) Assignee: Nimble Storage, Inc., San Jose, CA (US)

( * ) Notice: Subject to any disclaimer, the term of this patent is extended or adjusted under 35 U.S.C. 154(b) by 0 days.

(21) Appl. No.: 14/221,894

(22) Filed: Mar. 21, 2014

(65) Prior Publication Data

US 2014/0337561 A1 Nov. 13, 2014

Related U.S. Application Data

(63) Continuation of application No. 13/595,211, filed on Aug. 27, 2012, now Pat. No. 8,719,488, which is a continuation of application No. 12/636,693, filed on Dec. 11, 2009, now Pat. No. 8,285,918.

(51) Int. Cl.
*G06F 12/00* (2006.01)
*G06F 12/02* (2006.01)
*G06F 12/08* (2006.01)

(52) U.S. Cl.
CPC ........ *G06F 12/0246* (2013.01); *G06F 12/0253* (2013.01); *G06F 12/0802* (2013.01); *G06F 12/0866* (2013.01); *G06F 2212/222* (2013.01); *G06F 12/0873* (2013.01); *G06F 2212/224* (2013.01); *G06F 2212/7205* (2013.01)

(58) Field of Classification Search
CPC ............ G06F 12/0866; G06F 12/0246; G06F 12/0253; G06F 12/0873; G06F 12/0802; G06F 2212/7205

See application file for complete search history.

(56) References Cited

U.S. PATENT DOCUMENTS

| | | | |
|---|---|---|---|
| 5,519,853 A * | 5/1996 | Moran et al. | 713/400 |
| 8,285,918 B2 * | 10/2012 | Maheshwari | 711/103 |
| 2005/0144396 A1 | 6/2005 | Eschmann et al. | |
| 2007/0005928 A1 | 1/2007 | Trika et al. | |
| 2007/0186065 A1 * | 8/2007 | Lee et al. | 711/159 |
| 2010/0174845 A1 * | 7/2010 | Gorobets et al. | 711/103 |

OTHER PUBLICATIONS

Office Action dated Dec. 21, 2011, from U.S. Appl. No. 12/636,693, filed Dec. 11, 2009, 8 pages.
Response to Office Action filed Apr. 13, 2012, from U.S. Appl. No. 12/636,693, filed Dec. 11, 2009, 13 pages.
Supplemental Response to Office Action filed Apr. 16, 2012, from U.S. Appl. No. 12/636,693, filed Dec. 11, 2009, 9 pages.
Final Office Action dated Jun. 15, 2012, from U.S. Appl. No. 12/636,693, filed Dec. 11, 2009, 11 pages.

(Continued)

*Primary Examiner* — Shawn X Gu
(74) *Attorney, Agent, or Firm* — Ascenda Law Group, PC

(57) ABSTRACT

A storage device made up of multiple storage media is configured such that a flash memory serves as a cache for data stored on a backend storage device having one or more magnetic storage media. The storage device includes a controller configured to maintain a direct mapping from respective backend block addresses of the backend storage device to respective physical addresses of the flash memory. Such mapping is used to translate a backend block address of the backend storage device at which a first block is stored into a physical address of the flash memory at which the first block is cached.

14 Claims, 5 Drawing Sheets

(56) References Cited

OTHER PUBLICATIONS

Response to Final Office Action filed Aug. 15, 2012, from U.S. Appl. No. 12/636,693, filed Dec. 11, 2009, 10 pages.

Office Action dated Mar. 20, 2013, from U.S. Appl. No. 13/595,211, filed Aug. 27, 2012, 8 pages.

Response to Office Action filed Oct. 10, 2013, from U.S. Appl. No. 13/595,211, filed Aug. 27, 2012, 6 pages.

* cited by examiner

FLASH MEMORY CACHE FOR DATA STORAGE DEVICE

RELATED APPLICATIONS

The present application is a Continuation of U.S. patent application Ser. No. 13/595,211 filed Aug. 27, 2012 (now issued as U.S. Pat. No. 8,719,488), which is a Continuation of U.S. patent application Ser. No. 12/636,693 filed Dec. 11, 2009, (now issued as U.S. Pat. No. 8,285,918), both of which are incorporated herein by reference.

FIELD OF THE INVENTION

The present invention relates to the use of a flash memory-based cache for data stored in a hard disk-based storage device and, in particular, to techniques for integrating cache management operations with write coalescing and providing other efficiencies in such a caching device.

BACKGROUND

As most computer users know, data storage is of paramount importance. Different forms of data storage devices have been developed to address different needs. For example, some data storage devices are optimized to allow very rapid read and write accesses, so as not to present a bottleneck to other processing operations involving the data being read from or written to the storage device. Usually, these high speed read/write storage devices can only accommodate a limited amount of data and/or are expensive. Other storage devices are designed to accommodate large volumes of data (e.g., terabytes of data), but operate at much slower speeds. Such devices are usually intended for applications where the cost of high speed storage devices is not justified.

A popular form of storage system is one that uses rapidly rotating disks coated with a magnetic material to store data in the form of magnetically encoded information elements. These so-called hard disk drives (HDD), or simply hard disks, are found in many personal computers and dedicated storage appliances. Hard disks can offer significant available storage space (e.g., on the order of terabytes), but the speed at which data can be read from such devices is limited by physical properties such as the size of the disk(s) on which the data is stored, the speed at which the disk(s) rotate, and the time required for the read head to be maneuvered into the correct position to read the requested data information elements (the so-called seek time).

So-called solid state storage devices, typically those that employ flash memory arrays as the storage medium, offer improved read times, in part because there are no moving parts associated with such a device. Write times, however, are often worse than those associated with hard disks because flash arrays can only be written in relatively large "erase block" sizes (e.g., typically 128 KB-512 KB), which must be erased and rewritten in their entirety even if only a small amount of data within the block needs to be updated.

To address the inefficiencies inherent with writes to a flash array, flash memory controllers typically employ a process known as write coalescing. This allows the flash controllers to deliver acceptable performance for random writes (i.e., writes to random, non-sequential addresses within the flash array). Write coalescing uses principles that were first developed for log structured file systems. In essence, this technique bundles together or coalesces a group of random writes so that the data associated with those applications is written to a physically contiguous region of flash memory, called a "segment" (in flash, a segment should be an integral multiple of the erase block size).

An associated process performed by the flash controller, known as "garbage collection", ensures that large segments of the flash array are kept available for the contiguous writes required for proper write coalescing. As an application updates data at arbitrary logical addresses, and those data blocks are written to new physical locations in the flash array, any preexisting versions of the data in previously written portions of the array are marked as "obsolete", meaning that these versions are no longer needed. Note, the data blocks referred to immediately above are best understood as units for writing to the flash and are different than the erase blocks referred to previously. These data blocks are typically much smaller than the erase blocks, e.g., on the order of 4 KB-8 KB, depending on the flash controller. Herein, the term block, when used by itself, should be understood as referring to these data blocks. The term erase block will be used when referring specifically to erase blocks.

The obsolete blocks tend to be scattered about the flash array, due to the nature of the random updates performed by the application making use of the data, but a garbage collection routine running on the flash controller periodically regenerates entire segments by copying non-obsolete blocks of data in previously written segments of the array into a smaller number of new segments and then erasing the old segments.

Today, new forms of storage devices that employ both flash memory and hard disks are being marketed. In some instances, the flash memory portion of these devices is being used as a cache for data stored on the hard disk. A cache is generally regarded to be a storage area that holds a subset of the data stored on a larger, generally slower, device. Here, the flash memory cache provides faster read access than the hard disk and so data stored in the cache portion of the device can be delivered more rapidly than if the data had to be accessed from the hard disk. Of course, while a flash memory-based cache offers advantages for reads, the problems inherent with random writes must still be addressed.

SUMMARY OF THE INVENTION

Embodiments of the present invention provide systems and methods in which a flash memory controller of a flash array configured as a cache for a disk-based storage device, consolidates information concerning blocks of obsolete data stored in the flash array with information concerning blocks of data stored in the flash array that a cache management routine running on the controller has determined may be removed from the cache; and erases (or instructs erasure of) segments containing one or more of the blocks of obsolete data and the blocks of data that the cache management routine has determined may be removed from the cache to produce reclaimed segments of the flash array. Each segment may include multiple blocks of the flash array. In various embodiments, the blocks of obsolete data may include data that has been made obsolete as a result of more recent versions of said data being written to the flash array. Further, the blocks of data that the cache management routine has determined may be removed from the cache may include data that is less frequently and/or recently used by an application accessing the cache than other data stored in the cache.

Prior to erasing segments containing one or more of the blocks of obsolete data and the blocks of data that the cache management routine has determined may be removed from the cache, the controller may write (or instruct writing) valid data from the segments to other segments in the flash array. In some cases, fewer than all of the segments containing one or more of the blocks of obsolete data and the blocks of data that the cache management routine has determined may be removed from the cache are erased. Further, the segments containing one or more of the blocks of obsolete data and the blocks of data that the cache management routine has determined may be removed from the cache may be ranked, and the segments erased according to their respective rankings. For example, the segments may be ranked according to a total number of blocks of obsolete data and the blocks of data that the cache management routine has determined may be removed from the cache each contains. Alternatively, the segments may be ranked according to a percentage of a total number of blocks of obsolete data and the blocks of data that the cache management routine has determined may be removed from the cache each contains to a total number of blocks in each segment.

The controller may further maintain a direct mapping of block addresses used by an application accessing data stored in the storage device with physical locations of said data within the flash memory.

These and other embodiments of the invention are discussed further below.

BRIEF DESCRIPTION OF THE DRAWINGS

The present invention is illustrated by way of example, and not limitation, in the figures of the accompanying drawings in which.

DETAILED DESCRIPTION

Described herein are techniques for improving the efficiency of flash memory storage devices when used as a data cache for hard disks.

As mentioned above, when compared to hard disks, flash memory provides relatively fast reads, but is slow when it comes to small writes (i.e., those which do not involve large amounts of data) at random addresses. Therefore, flash memory-based storage devices typically coalesce multiple writes destined for random addresses into contiguous regions in the flash array. However, such write coalescing requires concomitant garbage collection activities, which impose a significant processing load and impact application performance.

While one could, in general, implement a flash memory-based cache for a hard disk-based storage system simply by layering some cache management functions (e.g., functions for maintaining data likely to be used by an application in the cache while moving other data out of the cache) over a flash device that incorporates write coalescing, several inefficiencies would likely result. Accordingly, the present invention provides techniques that integrate cache management and write coalescing to yield efficiencies for such a device. More specifically, the present invention provides methods and systems which offer improved reductions in time and space overhead when looking up data in the cache, and which reduce the processing load imposed by garbage collection routines, thereby reducing the impact on application performance.

Figure 1A:
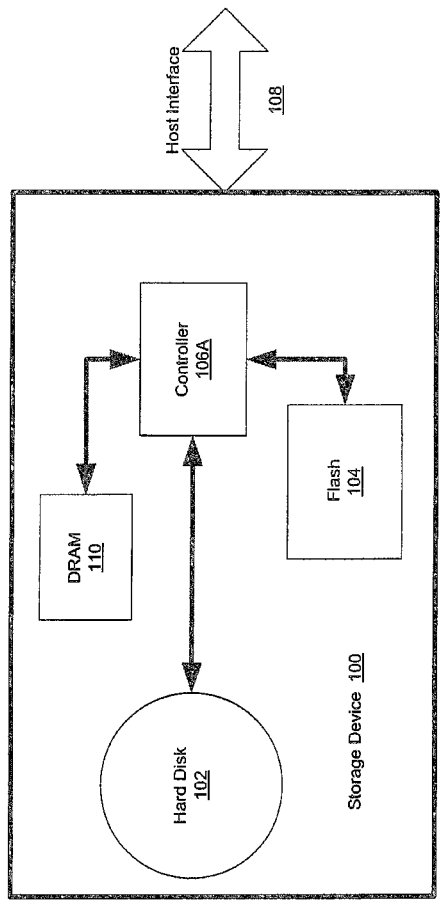
FIGS. 1A and 1B illustrate examples of storage devices employing a flash memory-based cache for a hard disk and configured for operation in accordance with embodiments of the present invention.

FIG. 1A shows an example of a storage device 100 in which embodiments of the present invention may be instantiated. Storage device 100 includes one or more hard disks 102 and a flash memory-based cache 104. The disks and/or the flash memory cache may be included in an integrated storage device 100 or attached as separate devices (see e.g., the embodiment illustrated in FIG. 1B). The disks 102 and flash memory-based cache 104 are under the control of a controller 106A, which may include firmware that instantiates integrated write coalescing/garbage collection and cache management routines as discussed herein. Storage device 100 is accessible (e.g., to applications running on a host machine) via a host interface 108, which may, in general, conform to specifications for disk-based storage devices common in the industry (e.g., an advanced host controller interface that uses a serial ATA bus, a small computer system interface (SCSI) or variants thereof, or an Internet protocol-based protocol, etc.). Except where particular protocols are called out, the systems and methods disclosed herein do not depend on the particular protocol being used and can be configured to operate correctly with all of them.

Controller 106A is, in some embodiments of the invention, configured such that cache management operations are integrated with write coalescing and garbage collection operations. This integration is achieved by providing a single mapping that maps backend block addresses (BBA) used by applications seeking to access data stored on storage device 100 to physical locations (PL) in the flash array. This single level of mapping avoids the need to first translate BBAs to cache block addresses (CBAs) and then translate the CBAs to PLs as would be required if cache management operations remained distinct from write coalescing operations. The map may be stored in a dynamic random access memory (DRAM) 110 accessible to controller 106A.

Figure 1B:
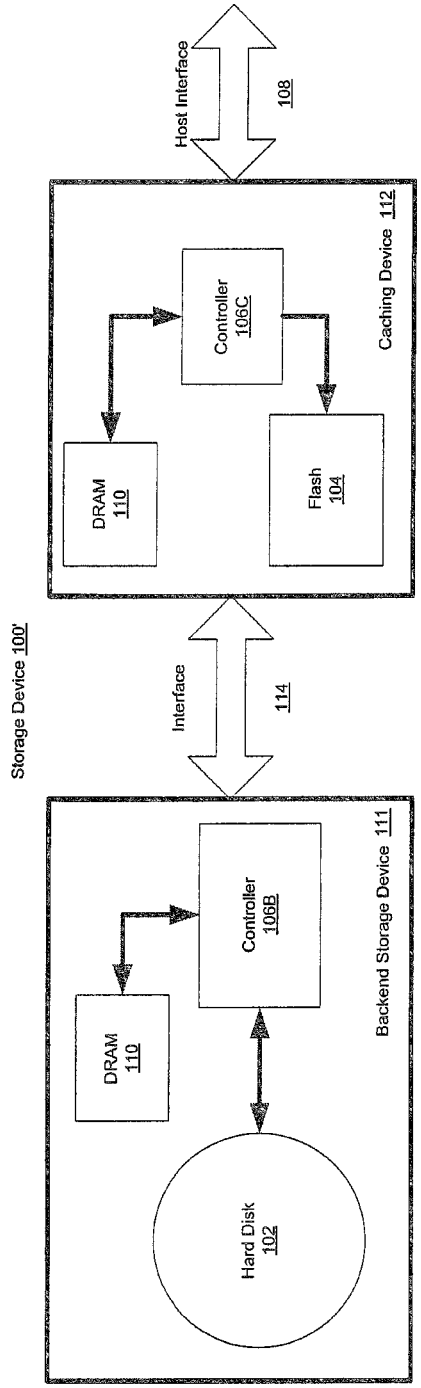

FIG. 1B illustrates an alternative example of a storage device 100', which includes a backend storage device 111, having a hard disk, and a caching device 112, having a flash cache, communicatively coupled with one another by an interface 114. In this example, each of the backend storage device and the caching device employ a controller, 106B and 106C, respectively. Controller 106B is configured to manage storing operations involving hard disk 102, while controller 106C is configured to manage storage operations for the storage device 100' in the manner described above for controller 106A. Thus, storage operations involving the hard disk and the flash cache may be distributed across multiple physical devices, but managed in accordance with the present invention.

To better understand the above, consider first how a conventional cache operates. As noted above, a cache generally stores a subset of the data stored on a larger (in terms of storage capacity), usually slower (in terms of read time), device. Thus, using a cache inherently requires a mapping from the large address space of the slower, backend device to the smaller address space of the cache. Such cache maps typically map a block address of the backend storage device (the BBA) to a block address in the cache (the CBA). If a block is not in the cache, the cache map does not have an entry for its BBA.

Figure 2:
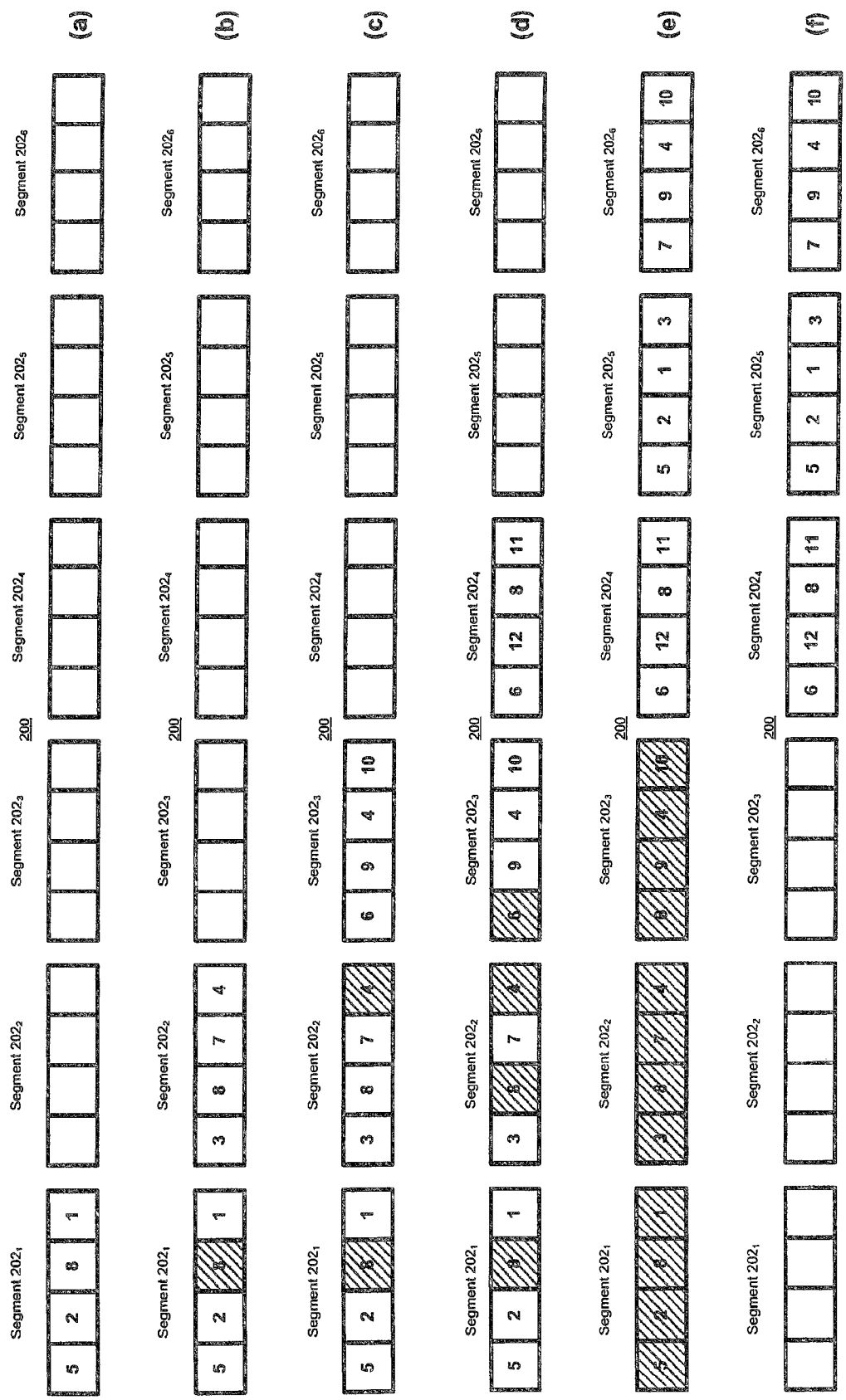
FIG. 2 illustrates an example of a conventional garbage collection process employed by flash memory storage devices.

The CBA is not, however, sufficient in terms of identifying the actual storage location of data within the flash array. Recall that because a flash array cannot be written at random, write coalescing is used to provide certain efficiencies. Referring to FIG. 2, a portion of a flash array 200 is shown. Assume that a set of segments $202_1$-$202_6$ of the cache device can each store four blocks. The segments of the flash array are each of a fixed (relatively large) size. As an application updates blocks at arbitrary addresses (5, 2, 8, and 1 in this example), the writes are coalesced so that the blocks are all written to segment $202_1$. This is shown in the top illustration 2(a). While this sort of write coalescing provides efficiencies in terms of write times, it means that a second map, one that maps CBAs to physical addresses within the flash array, must be maintained.

Figure 3:
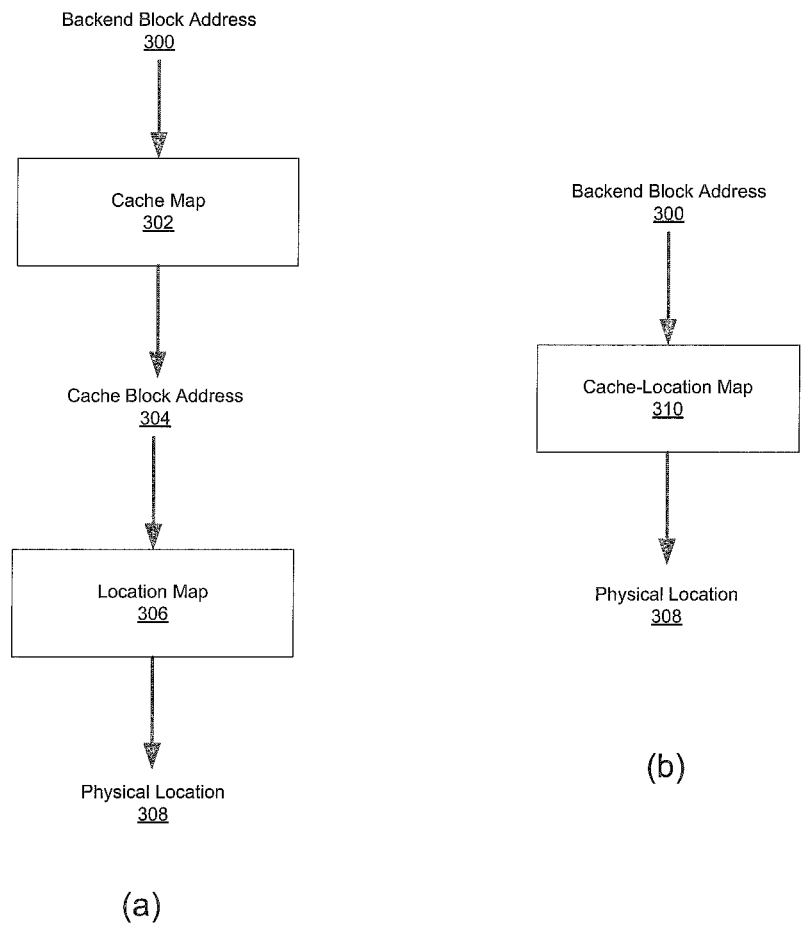
FIG. 3 illustrates distinctions between conventional two-level mappings required for address translation in a conventional flash memory device and a single level mapping as employed in embodiments of the present invention.

As noted, the present invention eliminates the need for separate BBA-to-CBA and CBA-to-PL maps and instead provides a single BBA-to-PL mapping for a flash memory-based cache. This is illustrated in FIG. 3. In illustration 3(a), the conventional two-layer mapping is illustrated with a BBA 300 being provided to a cache map 302 to produce a CBA 304, and the CBA 304 being provided to a location map 306 to produce a PL 308. In contrast, the present invention uses a single cache-location map 310 so that a BBA 300 can be directly translated to a PL 308, as shown in illustration 3(b).

But this efficient mapping process is not the only advantage offered by the present invention. A second efficiency concerns the ability of storage devices configured in accordance with the invention to reduce the load presented by garbage collection processes by leveraging the "temperature" of blocks of data. To better understand this notion, consider the management operations performed in a conventional cache.

In order to take better advantage of the read speed afforded by a cache, many devices employ adaptive routines that seek to ensure data that is used frequently by the host (i.e., applications running on the host) is always available in the cache. Typically, this involves making predictions about which data is likely to be needed (so-called "hot" data) and moving that data into the cache while also moving data less likely to be needed (so-called "cold" data) out of the cache to make room for the hot data. This movement of hot and cold data is referred to as cache management and while various techniques can be employed to make decisions about which data should be classified as hot or cold, such details are not critical to the present invention. That is, the present invention can be employed with any cache management routine. For example, cache management routines may determine the likelihood of access (or "temperature") of a particular block of data using heuristics based on how recently and/or frequently the block was accessed over a period of time, and such routines are well suited for use in connection with the present invention.

Returning to FIG. 2 and as shown in illustrations 2(b), 2(c) and 2(d), as an application continues to modify data, additional writes are made. As before, the writes are coalesced so that the data blocks are written to contiguous segments $202_2$ (illustration 2(b)), $202_3$ (illustration 2(c)) and $202_4$ (illustration 2(d)). Notice, however, that in making these writes, updated versions of previously written blocks 8, 4 and 6 must be written to new segments of the flash array, rather than overwriting a previous version thereof. This is an inherent limitation of write coalescing. The previously written version of a block becomes obsolete (as indicated by the cross hatching of previously written blocks in illustrations 2(b), 2(c) and 2(d)), and a controller in the flash device keeps track of these obsolete blocks (e.g., either directly or by tracking non-obsolete blocks and determining the obsolete blocks indirectly).

As should be apparent from this example, if the flash device were to continue writing new segments as the data is modified, the entire addressable storage space of the flash array would quickly be filled. To prevent this occurrence, the flash device reclaims storage space by identifying segments that have obsolete versions of data blocks and erasing them. Before the erase can be made, however, the non-obsolete blocks in the subject segments must be identified and "moved" (i.e., copied) to new segments. This is shown in illustration 2(e).

In this example, segments $202_1$, $202_2$ and $202_3$ were identified as having obsolete blocks (i.e., blocks 8, 4 and 6). The remaining blocks in these segments (i.e., blocks 5, 2, 1, 3, 7, 9, 4 and 10) were collected and copied into as-yet unused segments $202_5$ and $202_6$. As a result, segments $202_4$, $202_5$ and $202_6$ now contain valid data, while segments $202_1$, $202_2$ and $202_3$ all contain only obsolete data. As illustration 2(f) indicates, the segments containing the obsolete data are then erased, making them available for reuse.

This process of cleaning up segments that store obsolete data is known as garbage collection and, as should be apparent from the foregoing discussion, it involves a significant internal read and write load on the controller of the flash device. This reduces the available time for processing reads and writes requested by applications running on a host, thereby reducing the overall performance of the device. Further, the extra writes required for garbage collection reduce the effective write endurance of the flash.

The present invention improves the efficiency of the garbage collection operations by leveraging block temperature. Instead of dealing solely with data blocks that are garbage due to the existence of more recently written versions thereof, the garbage collection operations of flash devices configured in accordance with the present invention also treat "cold" data blocks as if they were garbage and make them eligible for reclamation as part of the garbage collection operation. As indicated above, this technique is independent of the actual criteria used to determine which blocks are sufficiently "cold" to be treated as obsolete, making it applicable to any cache management process.

Figure 4:
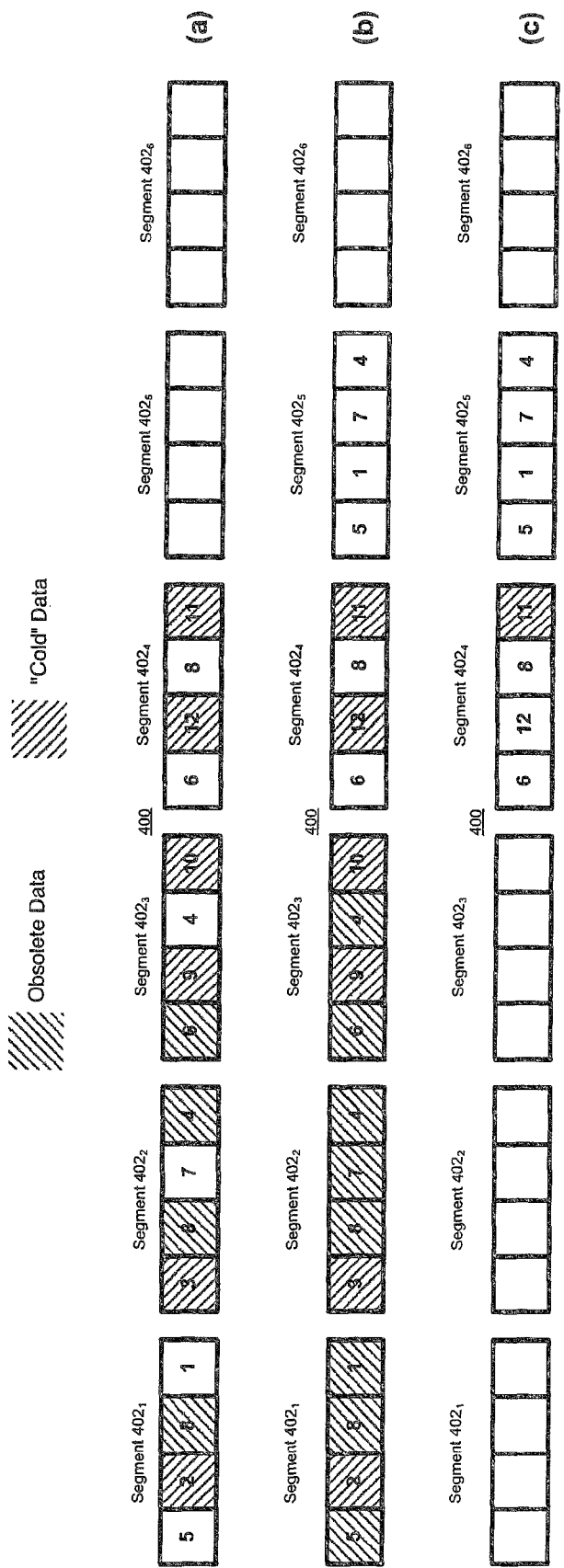
FIG. 4 illustrates an example of a garbage collection process that leverages information concerning cache management operations in accordance with embodiments of the present invention.

FIG. 4 shows an example of this process. In this sequence of illustrations 4(a), 4(b) and 4(c), the results of the same sequence of application updates shown in FIG. 2 are presented, but this time the effect of treating cold blocks as garbage is included. So, comparing illustration 4(a) to illustration 2(d), in a portion of a flash array 400, the same blocks 8, 4 and 6 in segments $402_1$, $402_2$ and $402_3$ have been made obsolete by newly written blocks 6, 4 and 8 in segments $402_4$, $402_3$ and $402_4$, respectively (note that block 8 in segment $402_1$ was previously obsoleted by a then-newly written block 8 in segment $402_2$, but that block was itself obsoleted by the next writing of block 8 in segment $402_4$).

This time, however, the garbage collection routine is provided with cache management information concerning cold block 2 in segment $402_1$, cold block 3 in segment $402_2$, cold blocks 9 and 10 in segment $402_3$, and cold blocks 12 and 11 in segment $402_4$. The cold nature of these blocks is indicated by cross hatching in the opposite direction to that used to highlight obsolete blocks. The information regarding the temperature of these blocks is provided to the garbage collection routine in accordance with the present invention and is obtained from the cache management process that oversees the caching of data.

When the garbage collection routine now searches for segments to free up by rewriting non-obsolete blocks to new segments and erasing the previously used segments, the routine seeks out those segments that have the greatest number or highest percentage of garbage blocks, considering cold blocks as garbage blocks, and treats them as candidates for reclamation. In this example, as shown in illustration 4(b), segments $402_1$, $402_2$ and $402_3$ were selected. Blocks 5 and 1 from segment $402_1$, block 7 from segment $402_2$ and block 4 from segment $402_3$ were rewritten to segment $402_5$ and the original copies of these blocks then flagged as obsolete. As shown in illustration 4(c), this allows three segments, $402_1$, $402_2$ and $402_3$, to be erased, freeing up new storage space for the application to write to.

Notice that by integrating the cache management and garbage collection operations a significant improvement in "write amplification" has been achieved. Write amplification is a measure of the processing load imposed by the garbage collection operations and can be expressed as a ratio of the total number of blocks written within the flash array (because of either application updates or garbage collection) to the total number of blocks updated by the application. In the stable state, the number of blocks written by the application is equal to the number of blocks freed by the garbage collection (GC) operation; therefore, the write amplification may be expressed as:

Write Amplification=(# of blocks copied by GC+# of blocks freed by GC)/# of blocks freed by GC In the example shown in FIG. 2, the garbage collection operation copied current blocks from three segments into two segments, effectively generating one additional free segment that could be used for application updates. Therefore, the write amplification of the device which performed those activities could be expressed as:

Write Amplification=(8+4)/4=3

In general write amplification is the inverse of the average fraction of obsolete or garbage blocks in segments collected by the garbage collection routine.

In comparison, the process illustrated in FIG. 4 yields:

Write Amplification=(4+8)/8=1.5

This represents a move of data from three segments to one segment to free up two segments and provides a write amplification one-half that of the scenario depicted in FIG. 2. Lower write amplification indicates a reduced processing load and so is a desirable goal. Again, the write amplification is, in general, the inverse of the average fraction of garbage blocks, which now includes both obsolete and cold blocks.

This reduction in garbage collection load is not possible where cache management is simply layered over a device that performs write coalescing and garbage collection. In such a scheme, the garbage collection routine would not have information concerning cold blocks and so no efficiencies would be obtained. Instead, as provided by the present invention, this significant improvement requires that the cache management operations be integrated with the garbage collection and write coalescing operations of the flash device.

Further expediency simplifications could be achieved if a flash memory device can be permitted to actually drop some non-garbage blocks of data instead of having to rewrite same to other segments during the garbage collection operations. That is, in situations where it is not critical that data be retained in the flash memory, for example where the flash memory serves as a cache for another persistent storage device or medium, the garbage collection routine could be configured to simply treat as garbage all of the blocks of segments that are comprised of mostly obsolete or cold blocks, even where no other copies of some of the blocks in that segment exist in the cache. This may be useful, for example, where space must be freed on an urgent basis or in other circumstances where it is more important to ensure space is available for new data than to ensure that old data is available in the cache. Segment $402_2$ in illustration 4(a) illustrates an example of a segment that could be treated in this fashion should the need arise.

It is also worth noting that the garbage collection routine need not address all possible segments having obsolete or cold blocks each time segments are to be reclaimed (i.e., for each garbage collection operation, only a portion of the total number of available segments are reclaimed, generally those having the highest number or percentage of obsolete/cold blocks). Notice in FIG. 4 that blocks 11 and 12 in segment $402_4$ were recognized as being cold, but these blocks were allowed to survive the garbage collection operations. In illustration 4(c), block 12 has reverted to "hot" status (a determination made by the cache management routine) and since it was not erased as part of the garbage collection operation is still available in the flash array. If the device is used as a cache, this would improve overall read times for this block.

In a related aspect of the present invention, extensions can be made to an ATA or SCSI "trim" command. The trim command has been proposed as a means of allowing applications to indicate that a filesystem can "trim" certain blocks of storage space which are not currently allocated within the filesystem. In accordance with the present invention, this technique can be extended to provide a command that notifies a storage device of changes in a block's temperature (e.g., from hot to cold or vice versa). This would allow the storage device to take actions similar to those discussed above with reference to FIG. 4 and reduce its garbage collection load by treating cold blocks as being eligible for erasure. However, such a use of the trim command would not be optimal because it would not allow the cache management routine to revert a cold block of data to hot status (i.e., a "trimmed" block of data cannot be "untrimmed"). The above-described integration of cache management and garbage collection permits such reversion.

Figure 5:
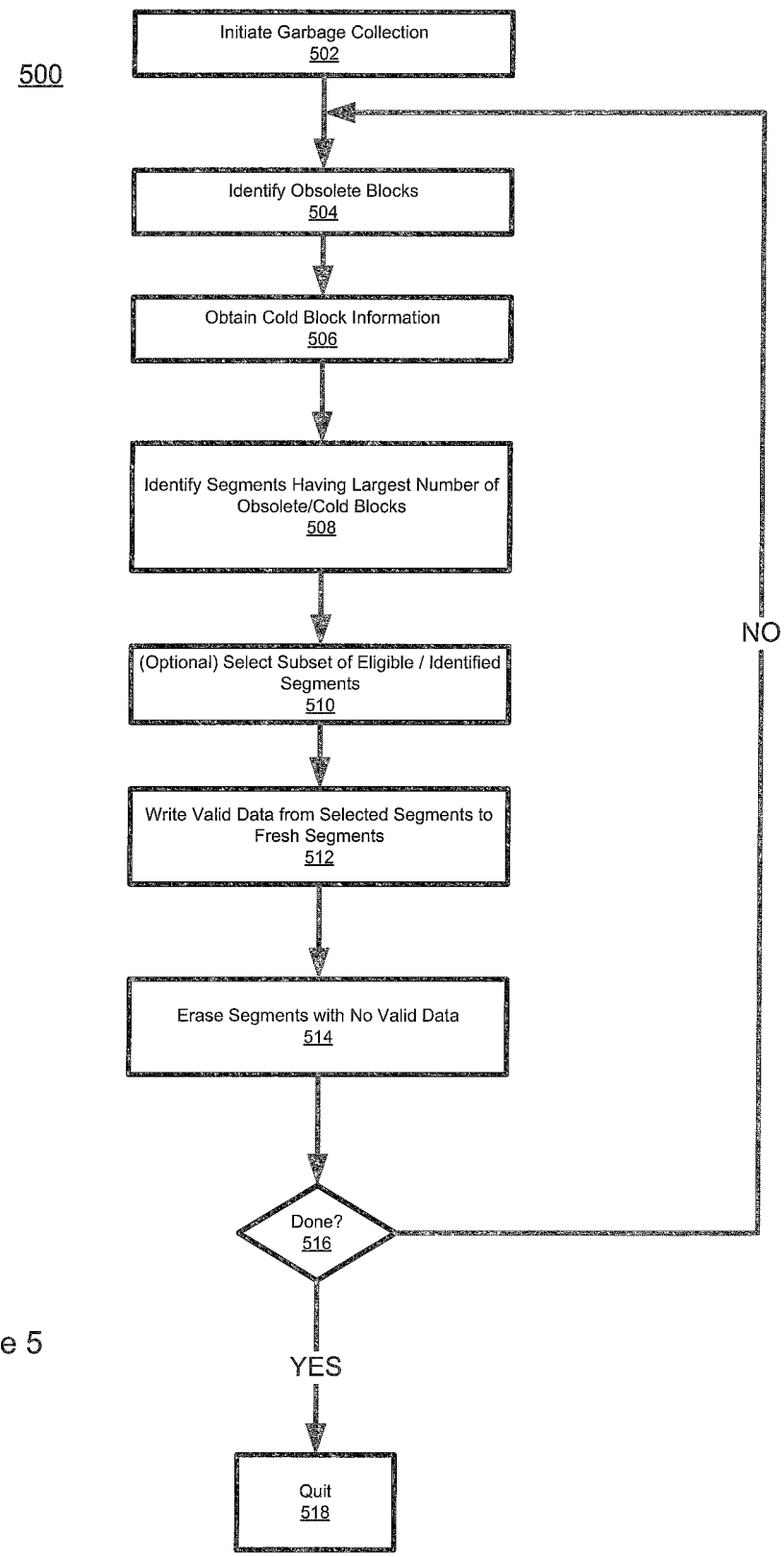
FIG. 5 is a flow diagram illustrating an example of a garbage collection routine that leverages information concerning cache management operations in accordance with embodiments of the present invention.

The present invention thus provides efficiencies by consolidating the mapping of block addresses to physical addresses into a single map, without the need for an intermediate cache block map, and further by integrating cache management with write coalescing and garbage collection. FIG. 5 is a flow diagram illustrating an example of a process 500 which may be performed by a flash controller in accordance with the present invention.

At 502, a garbage collection routine in accordance with the invention is initiated. As part of this routine, at 504, obsolete blocks are identified. The identification may be done as in conventional garbage collection routines.

At 506, information from a cache management routine (which may also be executing on the controller) regarding cold blocks is obtained. The information may, for example, be read from a table maintained by the cache management routine and indicate which blocks are considered to be cold. Note that the determination as to whether a block is hot or cold may be made in any conventional fashion, for example on the basis of which blocks are least recently used by an application, or other criteria.

At 508, the process identifies those segments of the flash array having obsolete and/or cold blocks and, optionally at 510, may select a subset of those segments to be reclaimed. This is an optional step because in some implementations a garbage collection routine may simply reclaim a pre-established number of segments each time it executes, for example any number of segments from one to all eligible segments may be reclaimed (although in most cases it will be best to limit reclamation to some number of segments less than all eligible segments in order to reduce the processing burden imposed by the garbage collection routine).

In determining which segments to reclaim, the garbage collection routine may rank the eligible segments (a segment is eligible if it has at least one obsolete or cold block) in terms of the number of obsolete/cold blocks they contain (or, conversely, the number of valid blocks they contain). For example, segments having more (e.g., either literally or on a percentage of blocks-to-segment basis) obsolete/cold blocks may be ranked higher than those having fewer obsolete/cold blocks. The garbage collection routine may operate to reclaim segments in order of rank from such a list, for example, each time reclaiming some pre-determined number of the ranked segments or some pre-determined fraction thereof. Alternatively the number of segments to be reclaimed may be determined dynamically based on a present processing load on the controller.

Regardless of how the segments identified for reclamation are determined, at 512 the valid data, if any, from those segments are rewritten to fresh segments as discussed above. This allows the copies of those previously valid blocks to now be identified as obsolete in the segments from which they were copied and, at 514, those segments are then erased. That is, the segments are reclaimed for use by an application running on a host that is accessing the storage device in which the flash device is operating, for example as a cache.

At 516, the process checks to see if it is done with the reclamation process and, if so, quits at 518. Otherwise, the process repeats from 504 by identifying new segments having obsolete blocks. In many instances, process 500 will execute continually in the background on the controller.

Thus, techniques for improving the efficiency of flash memory, especially when used as a data cache for hard disks, have been described. In the foregoing description, several examples were set forth and discussed in detail, but these examples should not be read as limiting the present invention, which is best measured in terms of the claims that follow.

What is claimed is:

1. A method for operating a flash memory controller of a flash array, the flash array (i) configured as a cache for a disk-based storage device and (ii) containing a plurality of segments, each segment containing a plurality of data blocks, the method comprising:
   for each of the segments, determining ones of the data blocks that are obsolete and ones of the data blocks that are cold, wherein obsolete data blocks are ones of the data blocks that are no longer needed and cold data blocks are ones of the data blocks that are not likely to be accessed;
   determining an aggregate number of obsolete blocks and cold blocks contained in each of the segments;
   selecting one or more of the segments based on the aggregate number of obsolete blocks and cold blocks contained in each of the segments;
   and
   erasing at least one of the one or more selected segments to produce one or more reclaimed segments of the flash array.

2. The method of claim 1, wherein the obsolete data blocks comprise data that has been made obsolete as a result of more recent versions of said data being written to the flash array.

3. The method of claim 1, wherein the cold data blocks in the cache comprise data that is less frequently and/or recently used by an application accessing the disk-based storage device than other data stored in the cache.

4. The method of claim 1, wherein prior to erasing at least one of the one or more selected segments, writing data blocks that are neither obsolete nor cold from the one or more selected segments to other segments in the flash array.

5. The method of claim 4, wherein more than one of the segments are selected and fewer than all of the selected segments are erased.

6. The method of claim 1, wherein at least one of the one or more selected segments of the cache are erased without copying any data into other segments of the cache.

7. The method of claim 1, wherein prior to erasing at least one of the one or more selected segments, writing data blocks that are not obsolete from the one or more selected segments to other segments in the flash array.

8. A storage device, comprising:
   one or more magnetic storage media;
   a flash memory (i) configured as a cache for data stored on the one or more magnetic storage media and (ii) containing a plurality of segments, each segment containing a plurality of data blocks; and
   a controller configured to manage operations of the cache by:
     for each of the segments, determining ones of the data blocks that are obsolete and ones of the data blocks that are cold, wherein obsolete data blocks are ones of the data blocks that are no longer needed and cold data blocks are ones of the data blocks that are not likely to be accessed;
     determining an aggregate number of obsolete blocks and cold blocks contained in each of the segments;
     selecting one or more of the segments based on the aggregate number of obsolete blocks and cold blocks contained in each of the segments;
   and
   erasing at least one of the one or more selected segments to produce one or more reclaimed segments of the cache.

9. The storage device of claim 8, wherein the obsolete data blocks comprise data that has been made obsolete as a result of more recent versions of said data being written to other blocks of the cache.

10. The storage device of claim 8, wherein the cold data blocks in the cache comprise data that is less frequently and/or recently used by an application accessing the disk-based storage device than other data stored in the cache.

11. The storage device of claim 8, wherein the controller is further configured to write data blocks that are neither obsolete nor cold from the one or more selected segments to other segments of the cache prior to erasing at least one of the one or more segments.

12. The storage device of claim 11, wherein more than one of the segments are selected and the controller is further configured to erase fewer than all of the selected segments.

13. The storage device of claim 8, wherein the controller is further configured to write data blocks that are not obsolete from the one or more selected segments to other segments of the cache prior to erasing at least one of the one or more selected segments.

14. A storage device, comprising multiple storage media, one such medium (i) serving as a cache for data stored on another such medium and (ii) containing a plurality of segments, each segment, and a controller configured to manage said cache by:

for each of the segments, determining ones of the data blocks that are obsolete and ones of the data blocks that are cold, wherein obsolete data blocks are ones of the data blocks that are no longer needed and cold data blocks are ones of the data blocks that are not likely to be accessed;

determining an aggregate number of obsolete blocks and cold blocks contained in each of the segments;

selecting one or more of the segments based on the aggregate number of obsolete blocks and cold blocks contained in each of the segments;

and erasing at least one of the one or more selected segments to produce one or more reclaimed segments of the cache.

* * * * *